(12) United States Patent
Yuan et al.

(10) Patent No.: US 12,219,791 B2
(45) Date of Patent: Feb. 4, 2025

(54) DISPLAY SUBSTRATE COMPRISING FIRST NOTCH FORMED IN SIDE OF AUXILIARY ELECTRODE AND MANUFACTURING METHOD, AND DISPLAY DEVICE HAVING SAME

(71) Applicants: Hefei BOE Joint Technology Co., Ltd., Anhui (CN); BOE TECHNOLOGY GROUP CO., LTD., Beijing (CN)

(72) Inventors: Can Yuan, Beijing (CN); Yongqian Li, Beijing (CN); Bin Zhou, Beijing (CN); Ning Liu, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 384 days.

(21) Appl. No.: 17/635,216

(22) PCT Filed: Apr. 21, 2021

(86) PCT No.: PCT/CN2021/088734
§ 371 (c)(1),
(2) Date: Feb. 14, 2022

(87) PCT Pub. No.: WO2022/222067
PCT Pub. Date: Oct. 27, 2022

(65) Prior Publication Data
US 2022/0359847 A1    Nov. 10, 2022

(51) Int. Cl.
*H01L 29/08*    (2006.01)
*H10K 50/824*    (2023.01)
(Continued)

(52) U.S. Cl.
CPC ....... *H10K 50/824* (2023.02); *H10K 59/1213* (2023.02); *H10K 59/1216* (2023.02); *H10K 59/131* (2023.02); *H10K 71/00* (2023.02)

(58) Field of Classification Search
CPC .............. H10K 50/824; H10K 59/131; H10K 59/1213; H10K 59/1216; H10K 71/00
(Continued)

(56) References Cited

U.S. PATENT DOCUMENTS

| 9,954,039 | B2 | 4/2018 | Im et al. |
| 11,678,528 | B2 * | 6/2023 | Kim ...................... H10K 71/00 257/72 |

(Continued)

FOREIGN PATENT DOCUMENTS

| CN | 105094483 A | 11/2015 |
| CN | 109671739 A | 4/2019 |

(Continued)

*Primary Examiner* — Phuc T Dang
(74) *Attorney, Agent, or Firm* — Muncy, Geissler, Olds & Lowe, P.C.

(57) ABSTRACT

The present disclosure provides a display substrate, a manufacturing method thereof, and a display device. The display substrate includes a substrate, and a compensation electrode, an auxiliary electrode, a light-emitting functional layer, and a cathode layer arranged on one side of the substrate. The auxiliary electrode is arranged on one side of the compensation electrode away from the substrate, and coupled to the compensation electrode. A first notch is formed in a side surface of the auxiliary electrode, and at least a part of the first notch extends in a direction parallel to the substrate. The light-emitting functional layer is arranged on one side of the auxiliary electrode away from the substrate, and interrupted at the first notch. The cathode layer is arranged on one side (Continued)

of the light-emitting functional layer away from the substrate, and coupled to the auxiliary electrode at the first notch.

18 Claims, 7 Drawing Sheets

(51) Int. Cl.
*H10K 59/121* (2023.01)
*H10K 59/131* (2023.01)
*H10K 71/00* (2023.01)

(58) Field of Classification Search
USPC .......................................................... 257/40
See application file for complete search history.

(56) References Cited

U.S. PATENT DOCUMENTS

| | | |
|---|---|---|
| 2017/0228068 A1 | 8/2017 | Pu et al. |
| 2019/0115403 A1 | 4/2019 | Kang et al. |
| 2022/0093893 A1 | 3/2022 | Zhang et al. |

FOREIGN PATENT DOCUMENTS

| | | | | |
|---|---|---|---|---|
| CN | 110176478 A | | 8/2019 | |
| CN | 110890406 A | | 3/2020 | |
| CN | 110911585 A | | 3/2020 | |
| CN | 110931653 A | | 3/2020 | |
| CN | 111081898 A | | 4/2020 | |
| CN | 111463360 A | * | 7/2020 | ......... H01L 27/3244 |
| CN | 111584758 A | | 8/2020 | |
| CN | 112103326 A | | 12/2020 | |
| CN | 112103399 A | | 12/2020 | |
| CN | 112310159 A | * | 2/2021 | ........... H01L 27/322 |
| EP | 3107130 A3 | | 4/2017 | |
| EP | 3331045 A1 | | 6/2018 | |
| JP | 2008135325 A | | 6/2008 | |

\* cited by examiner

US 12,219,791 B2

DISPLAY SUBSTRATE COMPRISING FIRST NOTCH FORMED IN SIDE OF AUXILIARY ELECTRODE AND MANUFACTURING METHOD, AND DISPLAY DEVICE HAVING SAME

CROSS-REFERENCE TO RELATED APPLICATION

This application is the U.S. national phase of PCT application No. PCT/CN2021/088734 filed on Apr. 21, 2021, which is incorporated herein by reference in its entirety.

TECHNICAL FIELD

The present disclosure relates to the field of display technology, and more particularly to a display substrate, a manufacturing method thereof, and a display device.

BACKGROUND

Organic Light-Emitting Diode (OLED) display device has attracted more and more attentions due to such advantages as low power consumption, wide color gamut and large size. The display device has various layouts, for example, it has a top emission structure, i.e., a cathode layer is made of a transparent material to emit light from a side of the display device where the cathode layer is arranged. The display device with such a structure specifically includes a driving circuitry film layer, a light-emitting element, and a color filter unit. The driving circuitry film layer is configured to provide a driving signal for the light-emitting element to enable the light-emitting element to emit light, and the light emitted by the light-emitting element passes through the color filter unit to achieve a display function of the OLED display device.

SUMMARY

An object of the present disclosure is to provide a display substrate, a manufacturing method thereof, and a display device.

In order to achieve the above object, the present disclosure provides the following technical solutions.

In one aspect, the present disclosure provides in some embodiments a display substrate, including: a substrate; a compensation electrode arranged on one side of the substrate; an auxiliary electrode arranged on one side of the compensation electrode away from the substrate and coupled to the compensation electrode, a first notch being formed in a side surface of the auxiliary electrode, and at least a part of the first notch extending in a direction parallel to the substrate; a light-emitting functional layer arranged at one side of the auxiliary electrode away from the substrate and interrupted at the first notch; and a cathode layer arranged on one side of the light-emitting functional layer away from the substrate and coupled to the auxiliary electrode at the first notch.

In a possible embodiment of the present disclosure, the auxiliary electrode includes a first electrode layer, a second electrode layer, and a third electrode layer laminated one on another in a direction away from the substrate, the first electrode layer is coupled to the compensation electrode, the light-emitting functional layer includes a first portion and a second portion separated from each other at the first notch, the first portion is arranged at one side of the third electrode layer away from the substrate, the second portion is arranged at one side of the first electrode layer away from the substrate, a spacer region is formed between the second portion and the second electrode layer arranged at the first notch, and the cathode layer is coupled to the first electrode layer at the spacer region.

In a possible embodiment of the present disclosure, the first electrode layer is provided with an opening, an orthogonal projection of the opening onto the substrate at least partially overlaps an orthogonal projection of the spacer region onto the substrate, and the cathode layer is directly coupled to the compensation electrode through the opening at the spacer region.

In a possible embodiment of the present disclosure, the cathode layer is coupled to the second electrode layer at the spacer region.

In a possible embodiment of the present disclosure, an orthogonal projection of the second electrode layer onto the substrate is surrounded by an orthogonal projection of the third electrode layer onto the substrate, and/or the orthogonal projection of the third electrode layer on the substrate is surrounded by an orthogonal projection of the first electrode layer onto the substrate.

In a possible embodiment of the present disclosure, the orthogonal projection of the second electrode layer onto the substrate is of an H-like shape and the orthogonal projection of the third electrode layer onto the substrate is of an H-like shape.

In a possible embodiment of the present disclosure, the display substrate further includes an anode layer, the anode layer includes a plurality of anode patterns, each anode pattern includes a first anode sub-pattern, a second anode sub-pattern and a third anode sub-pattern laminated one on another in a direction away from the substrate, and a second notch is formed in a side surface of the anode pattern between the first anode sub-pattern and the third anode sub-pattern.

In a possible embodiment of the present disclosure, the first anode sub-pattern and the third anode sub-pattern are made of indium tin oxide, and the second anode sub-pattern is made of aluminum.

In a possible embodiment of the present disclosure, the display substrate further includes a data line layer, the anode layer is arranged on one side of the data line layer away from the substrate, the compensation electrode is arranged at a same layer and made of a same material as the data line layer, the first electrode layer is arranged at a same layer and made of a same material as the first anode sub-pattern, the second electrode layer is arranged at a same layer and made of a same material as the second anode sub-pattern, and the third electrode layer is arranged at a same layer and made of a same material as the third anode sub-pattern.

In a possible embodiment of the present disclosure, the display substrate further includes a passivation layer and a planarization layer, the passivation layer is arranged between the substrate and the planarization layer, the passivation layer is provided with a first through hole, the planarization layer is provided with a second through hole, an orthogonal projection of the first through hole onto the substrate at least partially overlaps an orthogonal projection of the second through hole onto the substrate, at least a part of the first notch is arranged on one side of the planarization layer away from the substrate, the an orthogonal projection of the first notch onto the substrate overlaps the orthogonal projection of the second through hole onto the substrate and an orthogonal projection of the planarization layer onto the substrate, an orthogonal projection of a part of the first electrode layer onto the substrate overlaps the orthogonal projection of the second through hole onto the substrate, and a part of the first electrode layer is coupled to the compensation electrode through the first through hole.

In a possible embodiment of the present disclosure, the display substrate further includes a plurality of pixel units arranged in an array form on the substrate, the plurality of pixel units is divided into a plurality of pixel unit groups, and each pixel unit group includes at least one pixel unit. The display substrate includes a plurality of compensation electrodes corresponding to the plurality of pixel unit groups respectively, and each compensation electrode extends along a first direction. The plurality of pixel unit groups include a target pixel unit group, the cathode layer includes a target portion covering the target pixel unit group and coupled to the compensation electrode corresponding to the target pixel unit group via a first electrode layer of at least one auxiliary electrode.

In a possible embodiment of the present disclosure, each pixel unit group includes two pixel units arranged along a second direction crossing the first direction, an orthogonal projection of the compensation electrode onto the substrate is arranged between orthogonal projections of two pixel units in the corresponding pixel unit group onto the substrate.

In a possible embodiment of the present disclosure, the display substrate further includes a plurality of sensing line corresponding to the plurality of pixel unit groups respectively, an orthogonal projection of each sensing line onto the substrate is arranged between the orthogonal projections of two pixel units in the corresponding pixel unit group onto the substrate, the compensation electrode and the sensing line corresponding to a same group of pixel unit group are arranged at intervals at a same layer, and the orthogonal projection of the second electrode layer of the auxiliary electrode onto the substrate overlaps the orthogonal projection of the compensation electrode onto the substrate and the orthogonal projection of the sensing line onto the substrate.

In a possible embodiment of the present disclosure, the compensation electrodes corresponding to the pixel unit groups arranged in a same column along the first direction are coupled to each other successively.

In a possible embodiment of the present disclosure, the pixel unit includes at least two sub-pixels arranged along a second direction crossing the first direction, each sub-pixel includes a sub-pixel driving circuitry and a light-emitting element, and the sub-pixel driving circuitry includes a first transistor, a second transistor, a third transistor and a storage capacitor. A gate electrode of the first transistor is coupled to a second electrode of the second transistor, a first electrode of the first transistor is coupled to a power supply line of the display substrate, and the second electrode of the first transistor is coupled to the light-emitting element. A gate electrode of the second transistor is coupled to a corresponding scanning line of the display substrate, and a first electrode of the second transistor is coupled to a corresponding data line. A gate electrode of the third transistor is coupled to a corresponding scanning line of the display substrate, a first electrode of the third transistor is coupled to the second electrode of the first transistor, and a second electrode of the third transistor is coupled to a corresponding sensing line. A first plate of the storage capacitor is coupled to the gate electrode of the first transistor, and a second plate of the storage capacitor is coupled to the second electrode of the first transistor.

In another aspect, the present disclosure provides in some embodiments a display device including the above-mentioned display substrate.

In yet another aspect, the present disclosure provides in some embodiments a method for manufacturing a display substrate, including: forming a compensation electrode on one side of a substrate; forming an auxiliary electrode on one side of the compensation electrode from the substrate, the auxiliary electrode being coupled to the compensation electrode, a first notch being formed in a side surface of the auxiliary electrode, at least a part of the first notch extending in a direction parallel to the substrate; forming a light-emitting functional layer on one side of the auxiliary electrode away from the substrate, the light-emitting functional layer being interrupted at the first notch; and forming a cathode layer on one side of the light-emitting functional layer away from the substrate, the cathode layer being coupled to the auxiliary electrode at the first notch.

In a possible embodiment of the present disclosure, the display substrate further includes a data line, and the forming the compensation electrode on the substrate includes forming the compensation electrode and the data line simultaneously through a single patterning process.

In a possible embodiment of the present disclosure, the forming the auxiliary electrode on one side of the compensation electrode away from the substrate includes: forming a first electrode layer, the first electrode layer being coupled to the compensation electrode; and forming a second electrode material layer and a third electrode material layer laminated one on another on one side of the first electrode layer away from the substrate, and patterning the second electrode material layer and the third electrode material layer simultaneously to form a second electrode layer and a third electrode layer, a first notch being formed between the first electrode layer and the third electrode layer.

In a possible embodiment of the present disclosure, the display substrate further includes an anode layer, the anode layer includes a plurality of anode patterns, and each anode pattern includes a first anode sub-pattern, a second anode sub-pattern, and a third anode sub-pattern laminated one on another in a direction away from the substrate. The forming the first electrode layer includes forming the first electrode layer and the first anode sub-pattern simultaneously through a single patterning process, and annealing the first electrode layer. The patterning the second electrode material layer and the third electrode material layer simultaneously to form the second electrode layer and the third electrode layer includes: patterning the second electrode material layer and the third electrode material layer simultaneously to form the second anode sub-pattern, the third anode sub-pattern, the second electrode layer and the third electrode layer simultaneously, and forming a second notch between the first anode sub-pattern and the third anode sub-pattern.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

Figure 1:
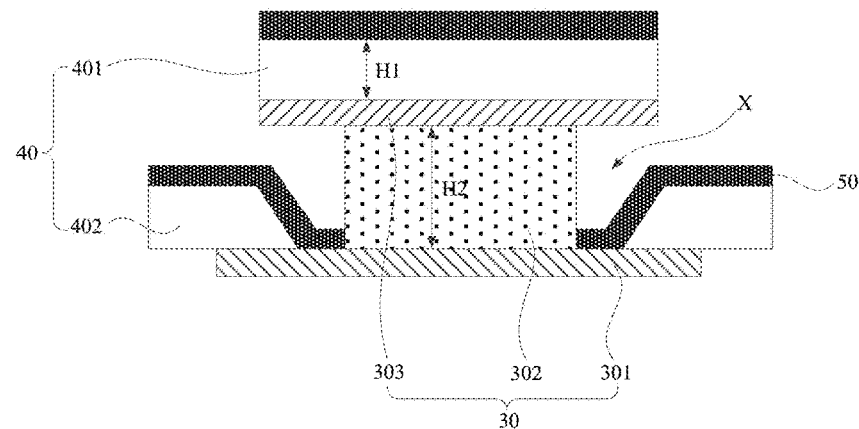
FIG. 1 is a schematic view showing the connection between a cathode layer and an auxiliary cathode in a display substrate according to one embodiment of the present disclosure.
Figure 2:
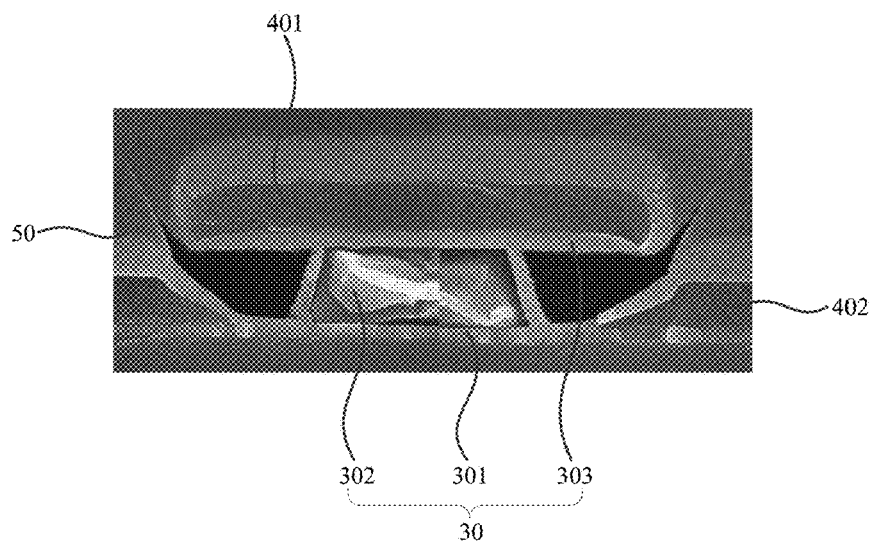
FIG. 2 is an electron micrograph showing the connection between the cathode layer and the auxiliary cathode in the display substrate according to one embodiment of the present disclosure.
Figure 3:
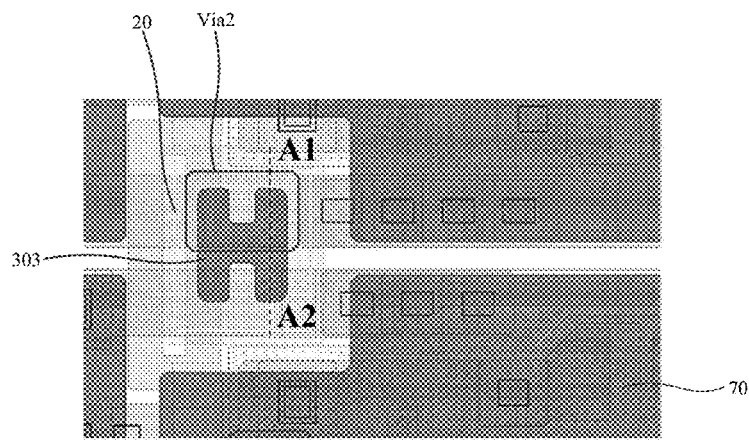
FIG. 3 is a schematic view showing the layout near auxiliary cathode in the display substrate according to one embodiment of the present disclosure.

The present disclosure will be described hereinafter in conjunction with the drawings and embodiments.

When a large-size OLED display device has a top emission structure, a cathode layer needs to be made of a transparent material to prevent light output of the display device from being adversely affected. However, the transparent material has a relatively large square resistance, so an IR drop of the cathode layer may increase.

With reference to FIGS. 1-4, the present disclosure provides in some embodiments a display substrate, which includes: a substrate 10, and a compensation electrode 20, an auxiliary electrode 30, a light-emitting functional layer 40 and a cathode layer 50 arranged on one side of the substrate 10.

The auxiliary electrode 30 is arranged on one side of the compensation electrode 20 away from the substrate 10, and coupled to the compensation electrode 20. A first notch X is formed in a side face of the auxiliary electrode 30, and at least a part of the first notch X extends in a direction parallel to the substrate 10. The light-emitting functional layer 40 is arranged on the side of the auxiliary electrode 30 away from the substrate 10, and interrupted at the first notch X. The cathode layer 50 is arranged on one side of the light-emitting functional layer 40 away from the substrate 10, and coupled to the auxiliary electrode 30 at the first notch X.

Illustratively, the compensation electrode 20 is made of a conductive material. Illustratively, the compensation electrode 20 includes a plurality of metal layers laminated one on another in a direction perpendicular to the substrate 10, and adjacent metal layers are made of different materials.

Illustratively, the compensation electrode 20 includes a compensation line.

Illustratively, the auxiliary electrode 30 is arranged on one side of the compensation electrode 20 away from the substrate 10, and an insulation layer is formed between the auxiliary electrode 30 and the compensation electrode 20. The insulation layer includes a passivation layer PVX and a planarization layer PLN, and the passivation layer PVX is arranged between the substrate 10 and the planarization layer PLN. Illustratively, the auxiliary electrode 30 is coupled to the compensation electrode 20 via a through hole penetrating through the insulation layer.

Illustratively, the first notch X is formed in the side surface of the auxiliary electrode 30, at least a part of the first notch X extends in the direction parallel to the substrate 10, and an orthogonal projection of the first notch X onto the substrate 10 is of an H-like shape.

Illustratively, the light-emitting functional layer 40 includes a light-emitting functional layer 40 capable of emitting white light. During the manufacture, the light-emitting functional layer 40 is entirely evaporated, and it is interrupted at the first notch X to expose a part of the auxiliary electrode 30 at the first notch X.

Illustratively, the light-emitting functional layer 40 includes at least an organic light-emitting material layer. Further, in addition to the organic light-emitting material layer, the light-emitting functional layer 40 further includes an election transport layer (ETL), an election injection layer (EIL), a hole transport layer (HTL), and a hole injection layer (HIL). At least one of the organic light-emitting material layer, the ETL, the EIL, the HTL and the HIL are evaporated as an entire surface.

Illustratively, the cathode layer 50 is formed on the one of the light-emitting functional layer 40 away from the substrate 10, and it is coupled to the exposed auxiliary electrode 30 at the first notch X. Illustratively, the cathode layer 50 is made of an indium zinc oxide such that the cathode layer 50 has high mobility and controllable resistivity.

Based on the above-mentioned structure of the display substrate, the first notch X is formed in the side surface of the auxiliary electrode 30, and the organic light-emitting functional layer is interrupted at the first notch X to expose a part of the auxiliary electrode 30 at the first notch X, so that the subsequently-formed cathode layer 50 is coupled to the auxiliary electrode 30 at the first notch X, thereby to enable the cathode layer to be indirectly coupled to the compensation electrode 20. Hence, in the embodiments of the present disclosure, the cathode layer 50 is coupled to the compensation electrode 20 through the auxiliary electrode 30, so as to reduce a resistance, as well as an IR drop, of the cathode layer 50.

Furthermore, the light-emitting functional layer 40 has a weak diffusion ability and the cathode layer 50 has a strong diffusion ability, after the light-emitting functional layer 40 has been interrupted at the first notch X, it is able to expose a part of the auxiliary electrode 30 at the first notch X. In addition, when the cathode layer 50 has a strong diffusion ability, it is able to achieve well coupling performance of the cathode layer 50 with the exposed auxiliary electrode 30 at the first notch X. Hence, in the embodiments of the present disclosure, it is able to ensure an overlapping success rate between the cathode layer 50 and the auxiliary cathode, thereby to effectively reduce the IR drop of the cathode layer 50.

In addition, at least a part of the first notch X extends in the direction parallel to the substrate 10 so as to provide a large contact area between the cathode layer 50 and the auxiliary electrode 30 at the first notch X, thereby to further ensure the overlapping success rate between the cathode layer 50 and the auxiliary cathode, and effectively reduce the IR drop of the cathode layer 50.

Figure 4:
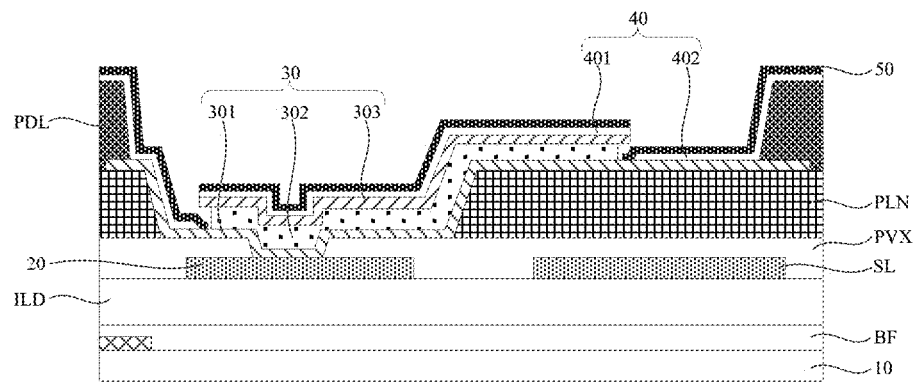
FIG. 4 is a sectional view of the display substrate along line A1A2 in FIG. 3.
Figure 5:
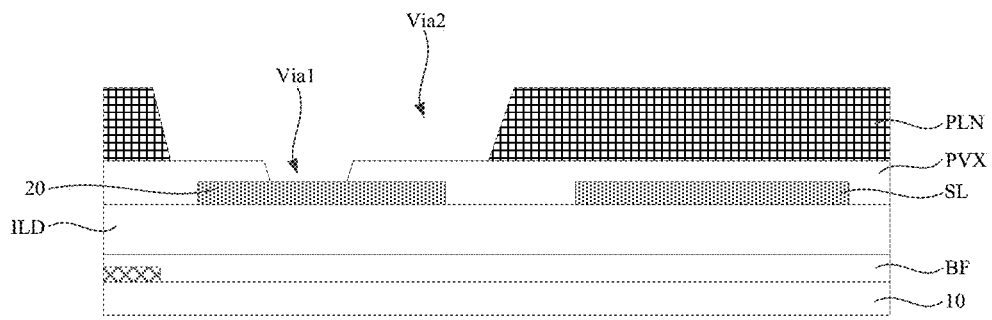
FIG. 5 is a sectional view of a first through hole and a second through hole along line A1A2 in FIG. 3.

As shown in FIGS. 1 and 4, in some embodiments of the present disclosure, the auxiliary electrode 30 includes a first electrode layer 301, a second electrode layer 302 and a third electrode layer 303 laminated one on another in the direction away from the substrate 10, and the first notch X is formed in the side surface of the auxiliary electrode 30 between the first electrode layer 301 and the third electrode layer 303. The first electrode layer 301 is coupled to the compensation electrode 20.

The light-emitting functional layer 40 includes a first portion 401 and a second portion 402 separated from each other at the first notch X. The first portion 401 is arranged on a side of the third electrode layer 303 away from the substrate 10, the second portion 402 is arranged on a side of the first electrode layer 301 away from the substrate 10, and a spacer region is formed between the second portion 402 and the second electrode layer 302 arranged at the first notch X. The cathode layer 50 is coupled to the first electrode layer 301 at the spacer region.

Illustratively, the first electrode layer 301 and the third electrode layer 303 are both made of an indium tin oxide, and the second electrode layer 302 is made of aluminum.

Illustratively, the first electrode layer 301 is formed through one patterning process, and the second electrode layer 302 and the third electrode layer 303 are simultaneously formed through another patterning process.

Illustratively, the first electrode layer 301 is annealed after the formation of the first electrode layer 301 so as to crystallize the first electrode layer 301, thereby to avoid the first electrode layer 301 from being adversely affected during a subsequent process of forming the second electrode layer 302 and the third electrode layer 303.

Illustratively, the second electrode layer 302 and the third electrode layer 303 are specifically formed as follows.

A second electrode material layer and a third electrode material layer are laminated one on another on a side of the first electrode layer 301 away from the substrate 10. Next, a photoresist is applied onto a side of the third electrode material layer away from the substrate 10, and then exposed to form a photoresist reserved region and a photoresist unreserved region. The photoresist reserved region corresponds to a region where the third electrode layer 303 is arranged and the photoresist unreserved region corresponds to the other region. Then, the photoresist at the photoresist unreserved region is developed and removed, and the second electrode material layer and the third electrode material layer are etched with the photoresist at the photoresist reserved region as a mask. The second electrode material layer is etched at an etching rate different from the third electrode material layer, so a boundary of the third electrode layer 303 goes beyond a boundary of the second electrode layer 302 in the direction parallel to the substrate 10. In this way, it is able to form the first notch X between the first electrode layer 301 and the third electrode layer 303.

Illustratively, the second electrode layer 302 has a thickness of 3000 Å and 8000 Å in a direction perpendicular to the substrate 10, with endpoints inclusive. Illustratively, as shown in FIG. 1, a thickness H2 of the second electrode layer 302 is greater than a thickness H1 of the light-emitting functional layer 40 in the direction perpendicular to the substrate 10, so as to enable the light-emitting functional layer 40 to be interrupted at the first notch X.

Illustratively, when forming the light-emitting functional layer 40 through evaporation, the light-emitting functional layer 40 is interrupted at the first notch X to form the first portion 401 and the second portion 402. The first portion 401 is arranged on a side of the third electrode layer 303 away from the substrate 10, at least a part of the second part 402 is arranged on a surface of the first electrode layer 301 away from the substrate 10, and the spacer region is formed between at least a part of the second part 402 and the second electrode layer 302 arranged at the first notch X, and the first electrode layer 301 is exposed at the spacer region. Then, the cathode layer 50 is formed through evaporation in such a manner that the cathode layer 50 overlaps the first electrode layer 301 at the spacer region, so as to enable the cathode layer 50 to be coupled to the compensation electrode 20 through the auxiliary electrode 30.

In the embodiments of the present disclosure, when the auxiliary electrode 30 includes the first electrode layer 301, the second electrode layer 302 and the third electrode layer 303 and the spacer region is formed between the light-emitting functional layer 40 and the second electrode layer 302, it is able for the cathode layer 50 to overlap the first electrode layer 301 at the spacer region, thereby to enable the cathode layer 50 to be coupled to the compensation electrode 20.

In some embodiments of the present disclosure, the first electrode layer 301 is provided with an opening, an orthogonal projection of the opening onto the substrate at least partially overlaps an orthogonal projection of the spacer region onto the substrate, and the cathode layer 50 is directly coupled to the compensation electrode 20 through the opening at the spacer region.

Illustratively, the orthogonal projection of the opening onto the substrate coincides with the orthogonal projection of the spacer region onto the substrate.

Illustratively, the orthogonal projection of the opening onto the substrate is surrounded by the orthogonal projection of the spacer region onto the substrate.

Through the above-mentioned arrangement, the cathode layer 50 is directly coupled to the compensation electrode 20 through the opening at the spacer region, it is able to further improve the connection performance between the cathode layer 50 and the compensation electrode 20.

As shown in FIG. 1, in some embodiments of the present disclosure, the cathode layer 50 is coupled to the second electrode layer 302 at the spacer region.

Through the above-mentioned arrangement, it is able to ensure the overlapping success rate between the cathode layer 50 and the auxiliary cathode in a better manner, thereby to effectively reduce the IR drop of the cathode layer 50.

As shown in FIGS. 1-4, in some embodiments of the present disclosure, an orthogonal projection of the second electrode layer 302 onto the substrate 10 is surrounded by an orthogonal projection of the third electrode layer 303 onto the substrate 10, and/or the orthogonal projection of the third electrode layer 303 onto the substrate 10 is surrounded by the orthogonal projection of the first electrode layer 301 onto the substrate 10.

Illustratively, the orthogonal projection of the second electrode layer 302 onto the substrate 10 is surrounded by an orthogonal projection of the first electrode layer 301 onto the substrate 10.

In the embodiments of the present disclosure, when the orthogonal projection of the second electrode layer 302 onto the substrate 10 is surrounded by the orthogonal projection of the third electrode layer 303 onto the substrate 10, the first notch X extends along the entire boundary of the second electrode layer 302. At the same time, when the orthogonal projection of the third electrode layer 303 onto the substrate 10 is surrounded by the orthogonal projection of the first electrode layer 301 onto the substrate 10, the cathode layer 50 is coupled to the first electrode layer 301 at any position of the first notch X. Hence, it is able to effectively increase an overlapping area between the cathode layer 50 and the first electrode layer 301, and ensure the overlapping success rate between the cathode layer 50 and the auxiliary cathode in a better manner, thereby to effectively reduce the IR drop of the cathode layer 50.

As shown in FIGS. 3, 4, 14 and 15, in some embodiments of the present disclosure, the orthogonal projection of the second electrode layer 302 onto the substrate 10 is of an H-like shape and the orthogonal projection of the third electrode layer 303 onto the substrate 10 is of an H-like shape.

Through the above-mentioned arrangement, the orthogonal projection of the first notch X onto the substrate 10 is provided with an H-like shape, and an extension length of the first notch X greatly increases. In this way, it is able to maximize an overlapping edge of the cathode layer 50 with the first electrode layer 301, increase the overlapping area, improve the overlapping success rate between the cathode layer 50 and the auxiliary cathode, reduce the overlapping resistance, and effectively reduce the IR drop of the cathode layer 50.

In some embodiments of the present disclosure, the display substrate further includes an anode layer 80. The anode layer 80 includes a plurality of anode patterns, and each anode pattern includes a first anode sub-pattern, a second anode sub-pattern, and a third anode sub-pattern laminated one on another in the direction away from the substrate. A second notch is formed in a side surface of the anode pattern 80 between the first anode sub-pattern and the third anode sub-pattern.

Figure 15:
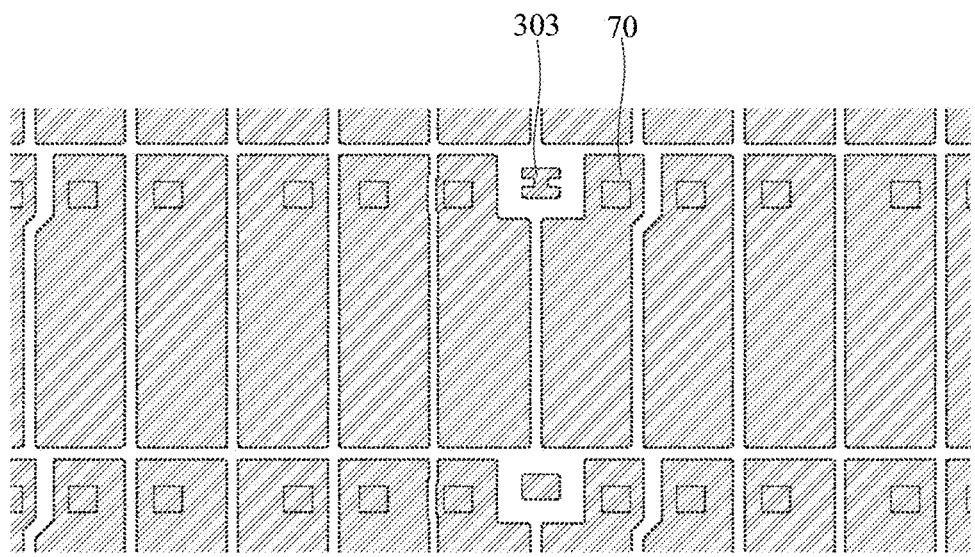
FIG. 15 is a schematic view showing the third electrode layer and the compensation anode layer in FIG. 9.

It should be appreciated that, FIG. 15 shows the third anode sub-pattern 70 arranged at a same layer as the third electrode layer 303.

In some embodiments of the present disclosure, the first anode sub-pattern and the third anode sub-pattern are made of indium tin oxide, and the second anode sub-pattern is made of aluminum.

Since the second anode sub-pattern is etched at an etching rate different from the third anode sub-pattern, a boundary of the third anode sub-pattern goes beyond a boundary of the second anode sub-pattern in the direction parallel to the substrate 10, so that the second notch is formed between the first anode sub-pattern and the third anode sub-pattern.

Through the above-mentioned arrangement, each anode pattern includes the first anode sub-pattern, the second anode sub-pattern and the third anode sub-pattern laminated one on another in the direction away from the substrate, so it is able to effectively improve signal transmission performance of the anode pattern.

Figure 10:
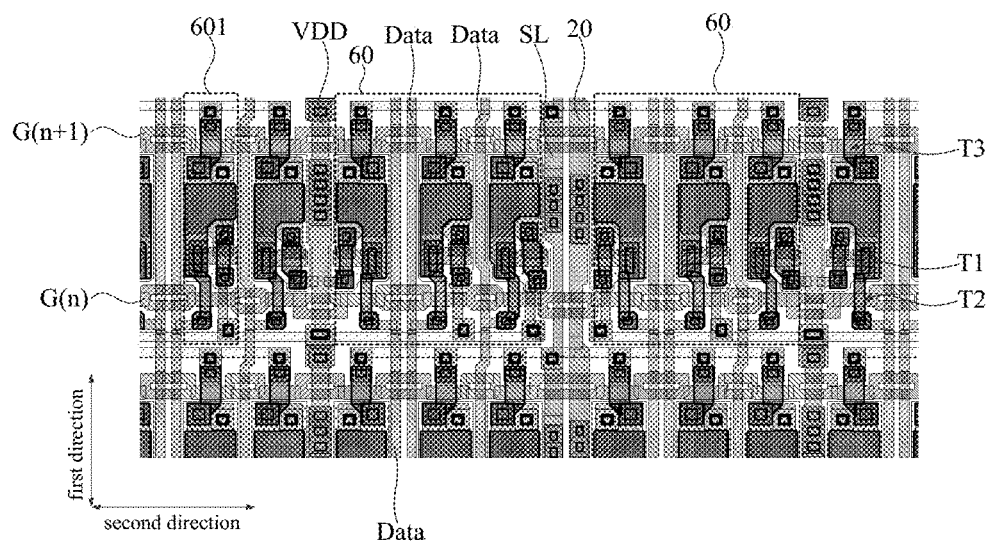
FIG. 10 is a schematic view showing the layout of the sub-pixel driving circuitries in FIG. 9.
Figure 11:
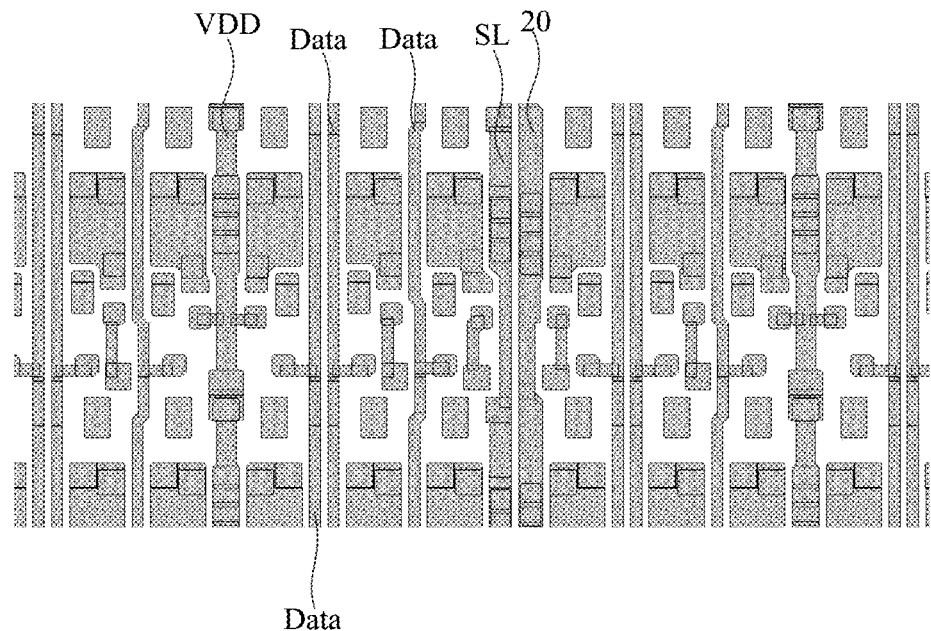
FIG. 11 is a schematic view showing the layout of a source/drain metal layer in FIG. 9.
Figure 12:
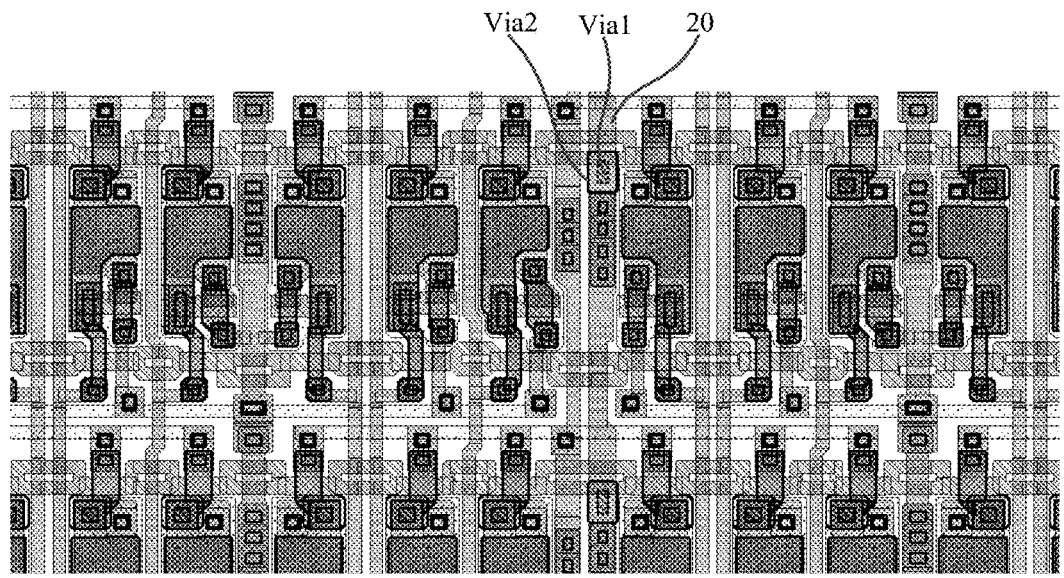
FIG. 12 is a schematic view showing the sub-pixel driving circuitry after the formation of a passivation layer and a planarization layer in FIG. 9.
Figure 13:
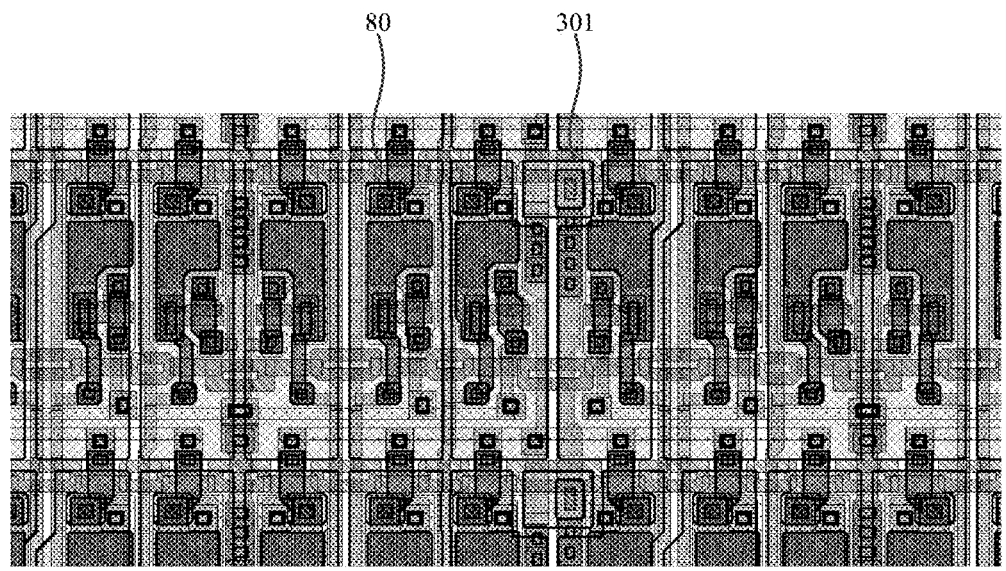
FIG. 13 is a schematic view showing the sub-pixel driving circuitry after the formation of an anode layer and a first electrode layer in FIG. 9
Figure 14:
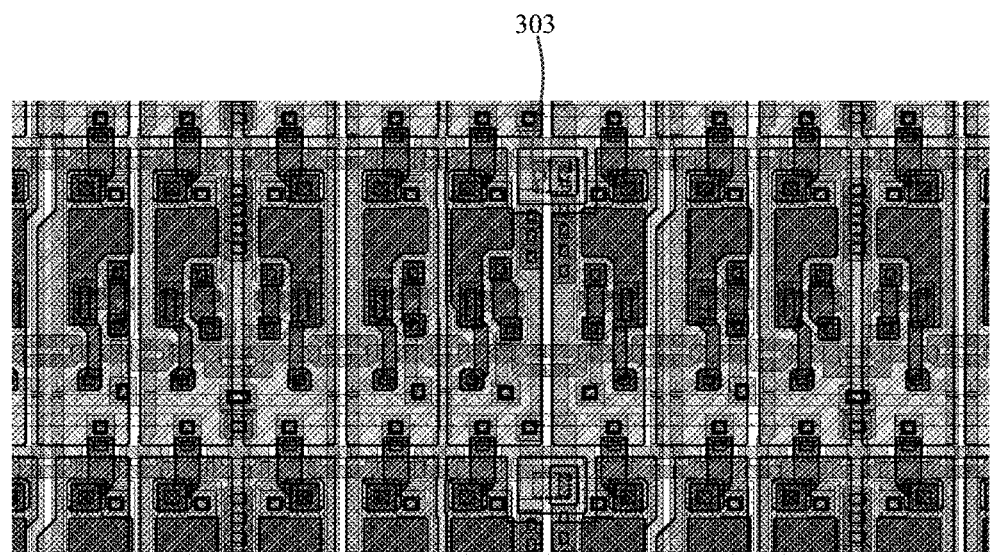
FIG. 14 is a schematic view showing the sub-pixel driving circuitry after the formation of a third electrode layer and a compensation anode layer in FIG. 9.

As shown in FIGS. 10, 11 and 13, in some embodiments of the present disclosure, the display substrate further includes a data line layer, and the anode layer 80 is arranged on a side of the data line layer away from the substrate 10. The compensation electrode 20 is arranged at a same layer and made of a same material as a data line Data, the first electrode layer 301 is arranged at a same layer and made of a same material as the first anode sub-pattern, the second electrode layer 302 is arranged at a same layer and made of a same material as the second anode sub-pattern, and the third electrode layer 303 is arranged at a same layer and made of a same material as the third anode sub-pattern.

Illustratively, the data line layer includes a plurality of data lines Data each configured to provide a data signal to sub-pixels in the display substrate.

Illustratively, the anode layer 80 includes the plurality of anode patterns corresponding to a plurality of sub-pixels in the display substrate respectively, and each anode pattern is a part of a corresponding sub-pixel. The anode pattern is coupled to a sub-pixel driving circuitry in the corresponding sub-pixel, and configured to receive a driving signal from the corresponding sub-pixel driving circuitry.

As shown in FIG. 4, illustratively, the display substrate includes a buffer layer BF, an active layer, a first gate insulation layer, a first gate metal layer, an interlayer insulation layer, a source/drain metal layer, a passivation layer PVX, a planarization layer PLN, the anode layer 80, a pixel definition layer PDL, the second electrode layer 302, the third electrode layer 303, the light-emitting functional layer 40, and the cathode layer 50 laminated one on another in the direction away from the substrate 10. The above-mentioned film layers are sequentially formed.

As shown in FIG. 11, illustratively, the source/drain metal layer includes the compensation electrode 20 and the data line Data. The compensation electrode 20 is arranged at a same layer and made of a same material as the data line Data, so as to form the compensation electrode 20 and the data line Data through a single patterning process, thereby to simplify a manufacturing process of the display substrate and reduce the manufacture cost of the display substrate.

As shown in FIG. 13, the first electrode layer 301 is arranged at a same layer and made of a same material as the first anode sub-pattern, the second electrode layer 302 is arranged at a same layer and made of a same material as the second anode sub-pattern, and the third electrode layer 303 is arranged at a same layer and made of a same material as the third anode sub-pattern, so that the first electrode layer 301 and the first anode sub-pattern are formed through a single patterning process, the second electrode layer 302 and the second anode sub-pattern are formed through a single patterning process, and the third electrode layer 303 and the third anode sub-pattern are formed through a single patterning process. In this way, it is able to simplify the manufacturing process of the display substrate and reduce the manufacture cost of the display substrate.

As shown in FIGS. 4, 5, 9 and 12, in some embodiments of the present disclosure, the display substrate further includes the passivation layer PVX and the planarization layer PLN. The passivation layer PVX is arranged between the substrate 10 and the planarization layer PLN, the passivation layer PVX is provided with a first through hole Via1, the planarization layer PLN is provided with a second through hole Via2, an orthogonal projection of the first through hole Via1 onto the substrate 10 at least partially overlaps an orthogonal projection of the second through hole Via2 onto the substrate 10;

At least a part of the first notch X is arranged on a side of the planarization layer PLN away from the substrate 10, the orthogonal projection of the first notch X onto the substrate 10 overlaps the orthogonal projection of the second through hole Via2 onto the substrate 10 and an orthogonal projection of the planarization layer PLN onto the substrate 10.

The orthogonal projection of a part of the first electrode layer 301 onto the substrate 10 overlaps the orthogonal projection of the second through hole Via2 onto the substrate 10, and the part of the first electrode layer 301 is coupled to the compensation electrode 20 through the first through hole Via1.

Illustratively, the orthogonal projection of the second through hole Via2 onto the substrate 10 surrounds the orthogonal projection of the first through hole Via1 onto the substrate 10.

Illustratively, after the formation of the passivation layer PVX and the planarization layer PLN, the first electrode layer 301, the second electrode layer 302, and the third electrode layer 303 are formed, the orthogonal projection of a part of the first electrode layer 301 onto the substrate 10 overlaps the orthogonal projection of the second through hole Via2 onto the substrate 10, and the orthogonal projection of another part of the first electrode layer 301 onto the substrate 10 overlaps the orthogonal projection of the planarization layer PLN onto the substrate 10.

Illustratively, the orthogonal projection of the first electrode layer 301 onto the substrate 10 surrounds the orthogonal projection of the second through hole Via2 onto the substrate 10.

Illustratively, the orthogonal projection of the second electrode layer 302 onto the substrate 10 overlaps the orthogonal projection of the second through hole Via2 onto the substrate 10 and the orthogonal projection of the planarization layer PLN onto the substrate 10.

Illustratively, the orthogonal projection of the third electrode layer 303 onto the substrate 10 overlaps the orthogonal projection of the second through hole Via2 onto the substrate 10 and the orthogonal projection of the planarization layer PLN onto the substrate 10.

Through the above-mentioned arrangement, the orthogonal projection of the first notch X onto the substrate 10 overlaps the orthogonal projection of the second through hole Via2 onto the substrate 10 and the orthogonal projection of the planarization layer PLN onto the substrate 10, so that the first notch X extends along a wall of the second through hole Via2, and the extension length of the first notch X greatly increases. In this way, it is able to effectively increase the overlapping area between the cathode layer 50 and the first electrode layer 301, ensure the overlapping success rate between the cathode layer 50 and the auxiliary cathodes, reduce the contact resistance, and reduce the IR drop of the cathode layer 50.

Hence, in the embodiments of the present disclosure, depending on the manufacturing process of the auxiliary electrode 30 and an overlapping principle, it is able to optimize the overlapping of the auxiliary electrode 30, thereby to ensure the overlapping success rate and effectively reduce the IR Drop of the cathode layer 50.

Figure 9:
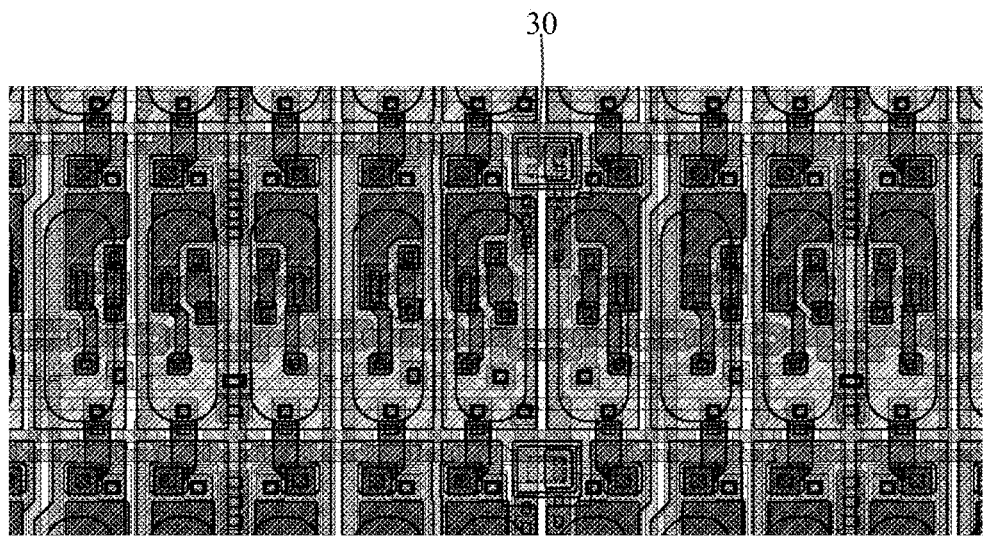
FIG. 9 is a schematic showing the layout of sub-pixels in the display substrate according to one embodiment of the present disclosure.

As shown in FIGS. 9 and 10, in some embodiments of the present disclosure, the display substrate further includes a plurality of pixel units 60 arranged in an array form on the substrate 10. The plurality of pixel units 60 is divided into a plurality of pixel unit groups, and each pixel unit group includes at least one pixel unit 60.

The display substrate includes a plurality of compensation electrodes 20 corresponding to the plurality of pixel unit groups respectively, and each compensation electrode 20 extends along a first direction.

The plurality of pixel unit groups includes a target pixel unit group, the cathode layer 50 includes a target portion covering the target pixel unit group. The target portion is coupled to the compensation electrode 20 corresponding to the target pixel unit group through the first electrode layer 301 of at least one auxiliary electrode 30.

Illustratively, the display substrate further includes a plurality of power supply lines VDD corresponding to the plurality of pixel unit groups respectively, and adjacent power supply lines VDD are coupled to each other in the first direction to form an integral structure.

Illustratively, the power supply line VDD is arranged on one side of the corresponding pixel group unit.

Illustratively, the plurality of pixel units 60 is divided into a plurality of pixel group units arranged in an array form. Illustratively, the pixel unit group include a plurality of pixel units 60 arranged along a second direction crossing the first direction.

Illustratively, the cathode layer 50 is an entire layer capable of covering the entire display substrate. The cathode layer 50 includes a plurality of cathode portions corresponding to the plurality of pixel units respectively, and each cathode portion covers a corresponding pixel unit. Illustratively, the plurality of cathode portions is formed as an integral structure. Illustratively, the target portion includes a cathode portion corresponding to each pixel unit in the target pixel unit group.

When the target portion is coupled to the compensation electrode 20 corresponding to the target pixel unit group through the first electrode layer 301 of at least one auxiliary electrode 30, one compensation electrode 20 at least one auxiliary electrode 30 are shared by the pixel units in the target pixel unit group, so as to reduce the difficulty in the layout of the compensation electrodes 20 and the auxiliary electrodes 30, and effectively reduce the IR drop of the cathode layer 50.

As shown in FIGS. 9 and 10, in some embodiments of the present disclosure, each pixel unit group include two pixel units 60 arranged along the second direction crossing the first direction, the orthogonal projection of the compensation electrode 20 onto the substrate 10 is arranged between the orthogonal projections of the two pixel units 60 in the corresponding pixel unit group onto the substrate 10.

Illustratively, the first direction includes a vertical direction and the second direction includes a horizontal direction.

Illustratively, each pixel unit includes at least two sub-pixels arranged along the second direction, each sub-pixel includes a sub-pixel driving circuitry, and the orthogonal projection of the compensation electrode 20 onto the substrate 10 is arranged between orthogonal projections of the sub-pixel driving circuitries of the two sub-pixels onto the substrate 10.

When the orthogonal projection of the compensation electrode 20 onto the substrate 10 is arranged between the orthogonal projections of two pixel units in the corresponding pixel unit group onto the substrate 10, it is able to ensure the distribution uniformity of the compensation electrodes 20 and the auxiliary electrodes 30, thereby to reduce the difficulty in the layout of the compensation electrodes 20 and the auxiliary electrodes 30, band effectively reduce the IR drop of the cathode layer 50.

More specifically, each pixel unit group include two pixel units arranged along the second direction, namely, the two pixel units share one auxiliary electrode 30 and one compensation electrode 20, and the corresponding cathode portions of the two pixel units overlap the compensation electrode 20 via the auxiliary electrode 30. In this case, a density of the auxiliary electrodes 30 is Pixel2_1, i.e., the two pixel units share one auxiliary electrode 30 and one compensation electrode 20.

Figure 6:
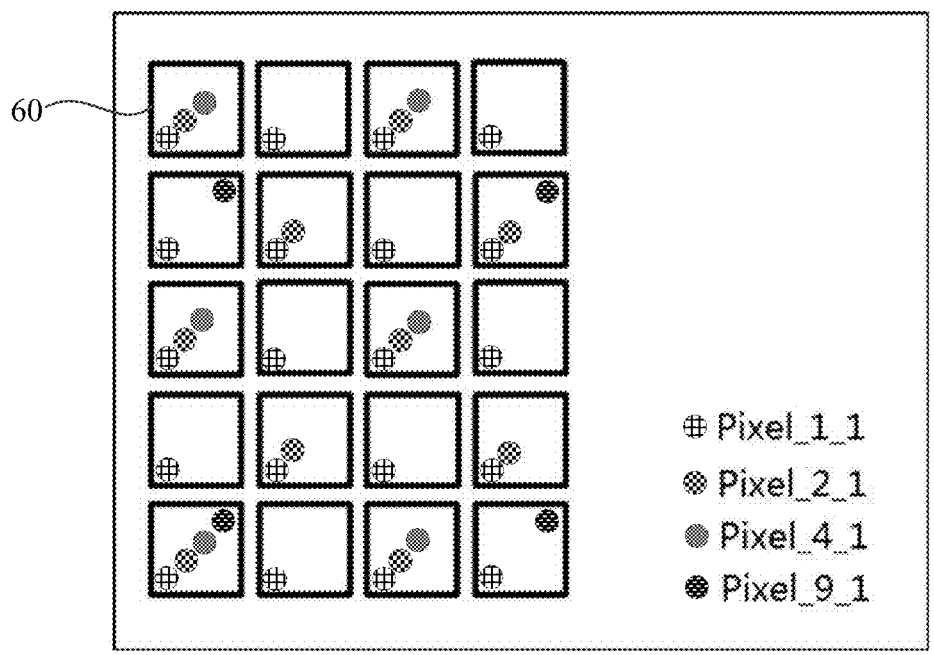
FIG. 6 a schematic view showing a density of auxiliary electrodes according to one embodiment of the present disclosure.
Figure 7:
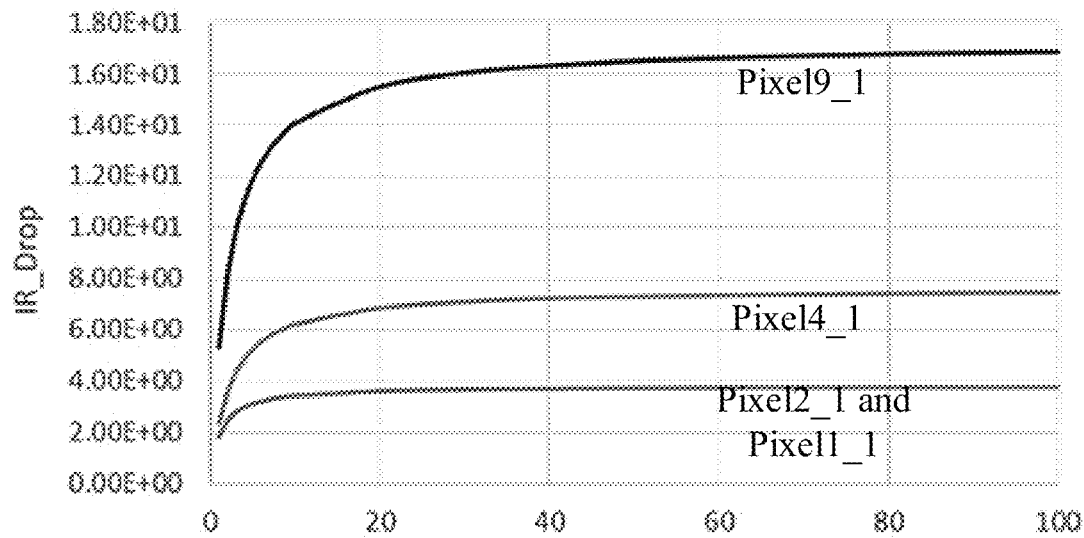
FIG. 7 is a schematic view showing an IR drop corresponding to the cathode layer at different densities of the auxiliary electrodes according to one embodiment of the present disclosure.

In the case that the density of the auxiliary electrodes 30 is Pixel1_1, namely, one pixel unit corresponds to one auxiliary electrode 30 and one compensation electrode 20, and in the case that the density of the auxiliary electrodes 30 is Pixel4_1, namely, four pixel units correspond to one auxiliary electrode 30 and one compensation electrode 20, and in the case that the density of the auxiliary electrodes 30 is Pixel9_1, namely, nine pixel units correspond to one auxiliary electrode 30 and one compensation electrode 20, a simulation result of the IR drop of the cathode layer 50 is obtained, and as shown in FIGS. 6 and 7, the IR drop is reduced most effectively in the case of Pixel2_1 and Pixel1_1. Considering a layout space, Pixel2_1 is an optimal mode. In this mode, it is able to effectively reduce the IR drop of the cathode layer 50 and provide a large-size OLED top-emission display substrate with an excellent display effect. It should be appreciated that, in FIG. 7, an x-axis represents a square resistance of the cathode layer 50, and a y-axis represents voltage.

As shown in FIGS. 10 and 11, in some embodiments of the present disclosure, the display substrate further includes a plurality of sensing lines SL corresponding to the plurality of pixel unit groups respectively, and an orthogonal projection of each sensing line SL onto the substrate 10 is arranged between the orthogonal projections of two pixel units in the corresponding pixel unit group onto the substrate 10.

The compensation electrode 20 and the sensing line SL corresponding to a same pixel unit group are arranged at intervals at a same layer, and the orthogonal projection of the second electrode layer 302 of the auxiliary electrode 30 onto the substrate 10 overlaps the orthogonal projection of the compensation electrode 20 onto the substrate 10 and the orthogonal projection of the sensing line SL onto the substrate 10.

Through the above-mentioned arrangement, it is able to improve the layout of the auxiliary electrodes 30 and reduce the difficulty in the layout of the auxiliary electrodes 30.

As shown in FIG. 10, in some embodiments of the present disclosure, the compensation electrodes 20 corresponding to the pixel unit groups in a same column are sequentially coupled to each other along the first direction.

Illustratively, the plurality of pixel unit groups is arranged in an array form and divided into a plurality of columns of pixel unit groups. The pixel unit groups in each column includes a plurality of pixel unit groups arranged along the first direction, and the compensation electrodes 20 corresponding to the pixel unit groups in each column are sequentially coupled to each other to form an integral structure.

When the compensation electrodes 20 corresponding to the pixel unit groups arranged in a same column are sequentially coupled to each other in the first direction, it is able to reduce the IR drop of the cathode layer 50 in a better manner.

Figure 8:
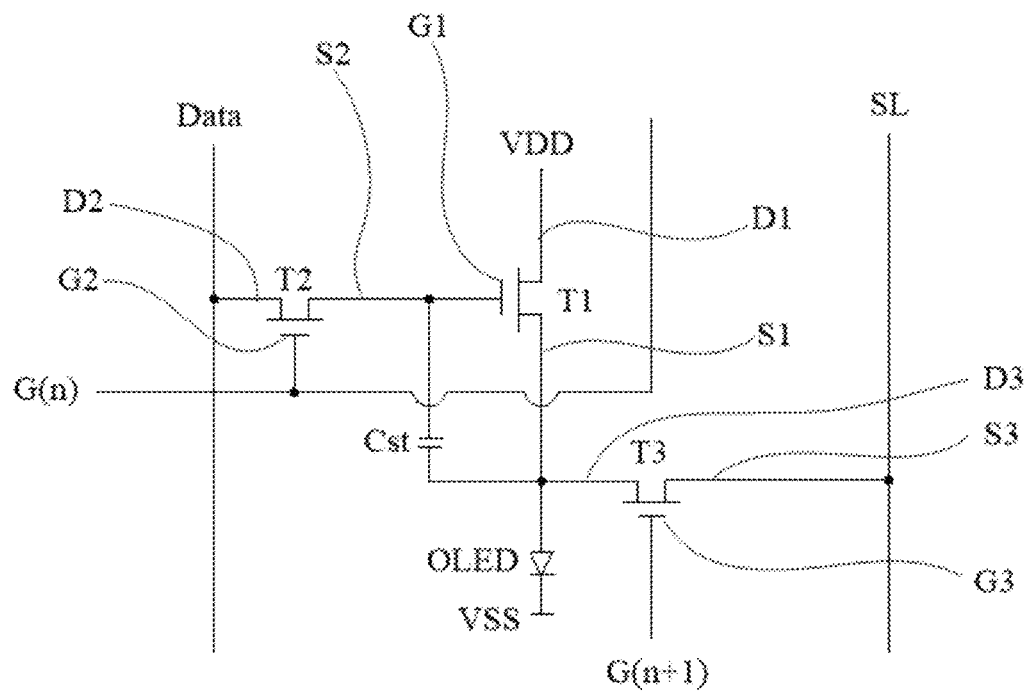
FIG. 8 is a schematic view showing the connection of sub-pixel driving circuitries in the display substrate according to one embodiment of the present disclosure.

As shown in FIGS. 8 and 10, in some embodiments of the present disclosure, the pixel unit includes at least two sub-pixels 601 arranged along the second direction crossing the first direction.

Each sub-pixel 601 includes a sub-pixel driving circuitry and a light-emitting element, and the sub-pixel driving circuitry includes a first transistor, a second transistor, a third transistor, and a storage capacitor.

A gate electrode of the first transistor is coupled to a second electrode of the second transistor, a first electrode of the first transistor is coupled to a power supply line of the display substrate, and a second electrode of the first transistor is coupled to the light-emitting element.

A gate electrode of the second transistor is coupled to a corresponding scanning line of the display substrate, and a first electrode of the second transistor is coupled to a corresponding data line Data.

A gate electrode of the third transistor is coupled to a corresponding scanning line of the display substrate, a first electrode of the third transistor is coupled to the second electrode of the first transistor, and a second electrode of the third transistor is coupled to a corresponding sensing lines SL.

A first plate of the storage capacitor is coupled to the gate electrode of the first transistor, and a second plate of the storage capacitor is coupled to the second electrode of the first transistor.

Specifically, the sub-pixel driving circuitry includes a first transistor T1, a second transistor T2, a third transistor T3, and a storage capacitor Cst. A first electrode D1 of the first transistor T1 is coupled to the power supply line VDD, a gate electrode G1 of the first transistor T1 is coupled to a first plate of the storage capacitor Cst, and a second electrode S1 of the first transistor T1 is coupled to a second plate of the storage capacitor Cst. A gate electrode G2 of the second transistor T2 is coupled to a corresponding scanning line G(n), a first electrode D2 of the second transistor T2 is coupled to a corresponding data line Data, and a second electrode S2 of the second transistor T2 is coupled to the gate electrode G1 of the first transistor T1. A gate G3 of the third transistor T3 is coupled to a corresponding scanning line G(n+), a second electrode S3 of the third transistor T3 is coupled to a sensing lines SL, and a first electrode D3 of the third transistor T3 is coupled to the second electrode S1 of the first transistor T1. An anode of the light-emitting element OLED is coupled to the second electrode S1 of the first transistor T1 and a cathode of the light-emitting element OLED is coupled to a negative power supply pole VSS.

The present disclosure further provides in some embodiments a display device which includes the above-mentioned display substrate.

According to the display substrate in the embodiments of the present disclosure, the first notch X is formed in the side surface of the auxiliary electrode 30, and the organic light-emitting functional layer is interrupted at the first notch X to expose a part of the auxiliary electrode 30 at the first notch X, so that the subsequently-formed cathode layer 50 is coupled to the auxiliary electrode 30 at the first notch X, thereby to enable the cathode layer to be indirectly coupled to the compensation electrode 20. Hence, in the embodiments of the present disclosure, the cathode layer 50 is coupled to the compensation electrode 20 through the auxiliary electrode 30, so as to reduce a resistance, as well as an IR drop, of the cathode layer 50.

Furthermore, the light-emitting functional layer 40 has a weak diffusion ability and the cathode layer 50 has a strong diffusion ability, after the light-emitting functional layer 40 has been interrupted at the first notch X, it is able to expose a part of the auxiliary electrode 30 at the first notch X. In addition, when the cathode layer 50 has a strong diffusion ability, it is able to achieve well coupling performance of the cathode layer 50 with the exposed auxiliary electrode 30 at the first notch X. Hence, in the embodiments of the present disclosure, it is able to ensure an overlapping success rate between the cathode layer 50 and the auxiliary cathode, thereby to effectively reduce the IR drop of the cathode layer 50. In addition, at least a part of the first notch X extends in the direction parallel to the substrate 10 so as to provide a large contact area between the cathode layer 50 and the auxiliary electrode 30 at the first notch X, thereby to further ensure the overlapping success rate between the cathode layer 50 and the auxiliary cathode, and effectively reduce the IR drop of the cathode layer 50.

When the display device includes the above-mentioned display substrate, it is also able to achieve the above-mentioned beneficial effect, which will not be particularly defined herein.

It should be appreciated that, the display device may be any product or member having a display function, such as television, display, digital photo frame, mobile phone and tablet computer.

The present disclosure further provides in some embodiments a method for manufacturing the display substrate, which includes: forming the compensation electrode 20 on one side of the substrate 10; forming the auxiliary electrode 30 on one side of the compensation electrode 20 away from the substrate 10, the auxiliary electrode 30 being coupled to the compensation electrode 20, the first notch X being formed in a side surface of the auxiliary electrode 30, and at least a part of the first notch X extending in a direction parallel to the substrate; forming the light-emitting functional layer 40 on a side of the auxiliary electrode 30 away from the substrate 10, the light-emitting functional layer 40being interrupted at the first notch X; and forming the cathode layer 50 on one side of the light-emitting functional layer 40 away from the substrate 10, the cathode layer 50 being coupled to the auxiliary electrode 30 at the first notch X.

Illustratively, the compensation electrode 20 is made of a conductive material. Illustratively, the compensation electrode 20 includes a plurality of metal layers laminated one on another in a direction perpendicular to the substrate 10, and adjacent metal layers are made of different materials.

Illustratively, after the formation of the compensation electrode 20, the passivation layer PVX and the planarization layer PLN are formed, and then the auxiliary electrode 30 is formed on a side of the planarization layer PLN away from the substrate 10. The auxiliary electrode 30 is coupled to the compensation electrode 20 via a through hole penetrating the insulation layer.

Illustratively, the first notch X is formed in the side surface of the auxiliary electrode 30, at least a part of the first notch X extends in a direction parallel to the substrate 10, and an orthogonal projection of the first notch X onto the substrate 10 is of an H-like shape.

Illustratively, the light-emitting functional layer 40 includes a light-emitting functional layer 40 capable of emitting white light. During the manufacture, the light-emitting functional layer 40 is entirely evaporated, and it is interrupted at the first notch X to expose a part of the auxiliary electrode 30 at the first notch X.

Illustratively, the cathode layer 50 is formed on the one of the light-emitting functional layer 40 away from the substrate 10, and it is coupled to the exposed auxiliary electrode 30 at the first notch X. Illustratively, the cathode layer 50 is made of an indium zinc oxide such that the cathode layer 50 has high mobility and controllable resistivity.

According to the display substrate manufactured by the method in the embodiments of the present disclosure, the first notch X is formed in the side surface of the auxiliary electrode 30, and the organic light-emitting functional layer is interrupted at the first notch X to expose a part of the auxiliary electrode 30 at the first notch X, so that the subsequently-formed cathode layer 50 is coupled to the auxiliary electrode 30 at the first notch X, thereby to enable the cathode layer to be indirectly coupled to the compensation electrode 20. Hence, in the embodiments of the present disclosure, the cathode layer 50 is coupled to the compensation electrode 20 through the auxiliary electrode 30, so as to reduce a resistance, as well as an IR drop, of the cathode layer 50.

Furthermore, the light-emitting functional layer 40 has a weak diffusion ability and the cathode layer 50 has a strong diffusion ability, after the light-emitting functional layer 40 has been interrupted at the first notch X, it is able to expose a part of the auxiliary electrode 30 at the first notch X. In addition, when the cathode layer 50 has a strong diffusion ability, it is able to achieve well coupling performance of the cathode layer 50 with the exposed auxiliary electrode 30 at the first notch X. Hence, in the embodiments of the present disclosure, it is able to ensure an overlapping success rate between the cathode layer 50 and the auxiliary cathode, thereby to effectively reduce the IR drop of the cathode layer 50.

In addition, at least a part of the first notch X extends in the direction parallel to the substrate 10 so as to provide a large contact area between the cathode layer 50 and the auxiliary electrode 30 at the first notch X, thereby to further ensure the overlapping success rate between the cathode layer 50 and the auxiliary cathode, and effectively reduce the IR drop of the cathode layer 50.

In some embodiments of the present disclosure, the display substrate further includes a data line Data. The forming the compensation electrode 20 on the substrate 10 includes forming the compensation electrode 20 and the data line Data through a single patterning process.

Specifically, a conductive layer is made of a conductive material, and a photoresist is applied to one side of the conductive layer away from the substrate 10. Next, the photoresist is exposed to form a photoresist reserved region and a photoresist unreserved region. The photoresist reserved region corresponds to a region where the compensation electrode 20 and the data line Data are arranged, and the photoresist unreserved region corresponds to the other regions. Then, the photoresist at the photoresist unreserved region is developed so as to remove the photoresist at the photoresist unreserved region, and the conductive layer is etched with the photoresist at the photoresist remaining region as a mask to form the compensation electrode 20 and the data line Data. Finally, the remaining photoresist is removed.

As mentioned above, the compensation electrode 20 and the data line Data are formed simultaneously through a single patterning process, so it is able to effectively simplify the manufacturing process of the display substrate and reduce the manufacture cost of the display substrate.

In some embodiments of the present disclosure, the forming the auxiliary electrode 30 on the side of the compensation electrode 20 away from the substrate 10 includes: forming the first electrode layer 301, the first electrode layer 301 being coupled to the compensation electrode 20; forming a second electrode material layer and a third electrode material layer laminated one on another on one side of the first electrode layer 301 away from the substrate 10, and patterning the second electrode material layer and the third electrode material layer simultaneously to form the second electrode layer 302 and the third electrode layer 303. The first notch X is formed between the first electrode layer 301 and the third electrode layer 303.

Illustratively, the first electrode layer 301 and the third electrode layer 303 are both made of indium tin oxide, and the second electrode layer 302 is made of aluminum.

Illustratively, the first electrode layer 301 is formed through one patterning process, and the second electrode layer 302 and the third electrode layer 303 are simultaneously formed through another patterning process.

Illustratively, the second electrode layer 302 and the third electrode layer 303 are specifically formed as follows.

A second electrode material layer and a third electrode material layer are laminated one on another on a side of the first electrode layer 301 away from the substrate 10. Next, a photoresist is applied onto a side of the third electrode material layer away from the substrate 10, and then exposed to form a photoresist reserved region and a photoresist unreserved region. The photoresist reserved region corresponds to a region where the third electrode layer 303 is arranged and the photoresist unreserved region corresponds to the other region. Then, the photoresist at the photoresist unreserved region is developed and removed, and the second electrode material layer and the third electrode material layer are etched with the photoresist at the photoresist reserved region as a mask. The second electrode material layer is etched at an etching rate different from the third electrode material layer, so a boundary of the third electrode layer 303 goes beyond a boundary of the second electrode layer 302 in the direction parallel to the substrate 10. In this way, it is able to form the first notch X between the first electrode layer 301 and the third electrode layer 303.

Illustratively, the second electrode layer 302 has a thickness of 3000 Å and 8000 Å in a direction perpendicular to the substrate 10, with endpoints inclusive. Illustratively, as shown in FIG. 1, a thickness H2 of the second electrode layer 302 is greater than a thickness H1 of the light-emitting functional layer 40 in the direction perpendicular to the substrate 10, so as to enable the light-emitting functional layer 40 to be interrupted at the first notch X.

In the embodiments of the present disclosure, when the auxiliary electrode 30 includes the first electrode layer 301, the second electrode layer 302 and the third electrode layer 303 and the spacer region is formed between the light-emitting functional layer 40 and the second electrode layer 302, it is able for the cathode layer 50 to overlap the first electrode layer 301 at the spacer region, thereby to enable the cathode layer 50 to be coupled to the compensation electrode 20.

In some embodiments of the present disclosure, the display substrate further includes the anode layer 80, the anode layer includes a plurality of anode patterns, and each anode pattern includes a first anode sub-pattern, a second anode sub-pattern, and a third anode sub-pattern laminated one on another in a direction away from the substrate. The forming the first electrode layer 301 includes forming the first electrode layer 301 and the first anode sub-pattern simultaneously through a single patterning process, and annealing the first electrode layer. The patterning the second electrode material layer and the third electrode material layer simultaneously to form the second electrode layer and the third electrode layer includes patterning the second electrode material layer and the third electrode material layer simultaneously to form the second anode sub-pattern, the third anode sub-pattern, the second electrode layer and the third electrode layer simultaneously, and forming a second notch between the first anode sub-pattern and the third anode sub-pattern.

Illustratively, the first electrode layer 301 is annealed after the formation of the first electrode layer 301, so as to crystallize the first electrode layer 301 and avoid the first electrode layer 301 from being adversely affected during a subsequent process of forming the second electrode layer 302 and the third electrode layer 303.

When the first electrode layer 301 and the anode layer 80 are formed a single patterning process, it is able to effectively simplify the manufacturing process of the display substrate and reduce the manufacture cost of the display substrate.

In some embodiments of the present disclosure, the forming the light-emitting functional layer 40 on one side of the auxiliary electrode 30 away from the substrate 10 includes forming the light-emitting functional layer 40 through evaporation. A thickness of the light-emitting functional layer 40 in the direction perpendicular to the substrate 10 is less than a thickness of the second electrode layer 302, the light-emitting functional layer 40 is interrupted at the first notch X to form the first portion 401 and the second portion 402, the first portion 401 is arranged at a side of the third electrode layer 303 away from the substrate 10, the second portion 402 is arranged at a side of the first electrode layer 301 away from the substrate 10, and the spacer region is formed between the second part 402 and the second electrode layer 302 arranged at the first notch X.

Illustratively, when forming the light-emitting functional layer 40 through evaporation, the light-emitting functional layer 40 is interrupted at the first notch X to form the first portion 401 and the second portion 402. The first portion 401 is arranged on a side of the third electrode layer 303 away from the substrate 10, at least a part of the second part 402 is arranged on a surface of the first electrode layer 301 away from the substrate 10, the spacer region is formed between at least a part of the second part 402 and the second electrode layer 302 arranged at the first notch X, and the first electrode layer 301 is exposed at the spacer region.

In some embodiments of the present disclosure, the forming the cathode layer 50 on the side of the light-emitting functional layer 40 away from the substrate 10 includes forming the cathode layer 50 on the side of the light-emitting functional layer 40 away from the substrate 10 through evaporation using a transparent conductive material. The cathode layer 50 is coupled to the first electrode layer 301 at the spacer region.

Illustratively, the cathode layer 50 is formed through evaporation using indium tin oxide, and it overlaps the first electrode layer 301 at the spacer region, so that the cathode layer 50 is coupled to the compensation electrode 20 through the auxiliary electrode 30.

It should be appreciated that, the expression "at a same layer" refers to that the film layers are arranged on a same structural layer. Alternatively, for example, the film layers on a same layer may be layer structures formed through forming thin layers for forming specific patterns through a single film-forming process and then patterning the film layers with a same mask through a single patterning process. Depending on different specific patterns, a single patterning process may include multiple exposure, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
   a substrate;
   a compensation electrode arranged on one side of the substrate;
   an auxiliary electrode arranged on one side of the compensation electrode away from the substrate and coupled to the compensation electrode, a first notch being formed in a side surface of the auxiliary electrode, and at least a part of the first notch extending in a direction parallel to the substrate;
   a light-emitting functional layer arranged at one side of the auxiliary electrode away from the substrate and interrupted at the first notch; and
   a cathode layer arranged on one side of the light-emitting functional layer away from the substrate and coupled to the auxiliary electrode at the first notch,
   wherein the auxiliary electrode comprises a first electrode layer, a second electrode layer, and a third electrode layer laminated one on another in a direction away from the substrate, the first electrode layer is coupled to the compensation electrode, the light-emitting functional layer comprises a first portion and a second portion separated from each other at the first notch, the first portion is arranged at one side of the third electrode layer away from the substrate, the second portion is arranged at one side of the first electrode layer away from the substrate, a spacer region is formed between the second portion and the second electrode layer arranged at the first notch, and the cathode layer is coupled to the first electrode layer at the spacer region.

2. The display substrate according to claim 1, wherein the first electrode layer is provided with an opening, an orthogonal projection of the opening onto the substrate at least partially overlaps an orthogonal projection of the spacer region onto the substrate, and the cathode layer is directly coupled to the compensation electrode through the opening at the spacer region.

3. The display substrate according to claim 1, wherein the cathode layer is coupled to the second electrode layer at the spacer region.

4. The display substrate according to claim 1, wherein an orthogonal projection of the second electrode layer onto the substrate is surrounded by an orthogonal projection of the third electrode layer onto the substrate, and/or the orthogonal projection of the third electrode layer on the substrate is surrounded by an orthogonal projection of the first electrode layer onto the substrate.

5. The display substrate according to claim 1, wherein the orthogonal projection of the second electrode layer onto the substrate is of an H-like shape and the orthogonal projection of the third electrode layer onto the substrate is of an H-like shape.

6. The display substrate according to claim 1, further comprising an anode layer, wherein the anode layer comprises a plurality of anode patterns, each anode pattern comprises a first anode sub-pattern, a second anode sub-pattern and a third anode sub-pattern laminated one on another in a direction away from the substrate, and a second notch is formed in a side surface of the anode pattern between the first anode sub-pattern and the third anode sub-pattern.

7. The display substrate according to claim 6, wherein the first anode sub-pattern and the third anode sub-pattern are made of indium tin oxide, and the second anode sub-pattern is made of aluminum.

8. The display substrate according to claim 6, further comprising a data line layer, wherein the anode layer is arranged on one side of the data line layer away from the substrate, the compensation electrode is arranged at a same layer and made of a same material as the data line layer, the first electrode layer is arranged at a same layer and made of a same material as the first anode sub-pattern, the second electrode layer is arranged at a same layer and made of a same material as the second anode sub-pattern, and the third electrode layer is arranged at a same layer and made of a same material as the third anode sub-pattern.

9. The display substrate according to claim 8, further comprising a passivation layer and a planarization layer, wherein the passivation layer is arranged between the substrate and the planarization layer, the passivation layer is provided with a first through hole, the planarization layer is provided with a second through hole, an orthogonal projection of the first through hole onto the substrate at least partially overlaps an orthogonal projection of the second through hole onto the substrate, at least a part of the first notch is arranged on one side of the planarization layer away from the substrate, the an orthogonal projection of the first notch onto the substrate overlaps the orthogonal projection of the second through hole onto the substrate and an orthogonal projection of the planarization layer onto the substrate, an orthogonal projection of a part of the first electrode layer onto the substrate overlaps the orthogonal projection of the second through hole onto the substrate, and a part of the first electrode layer is coupled to the compensation electrode through the first through hole.

10. The display substrate according to claim 1, further comprising a plurality of pixel units arranged in an array form on the substrate, wherein the plurality of pixel units is divided into a plurality of pixel unit groups, and each pixel unit group comprises at least one pixel unit, wherein the display substrate comprises a plurality of compensation electrodes corresponding to the plurality of pixel unit groups respectively, and each compensation electrode extends along a first direction, wherein the plurality of pixel unit groups comprise a target pixel unit group, the cathode layer comprises a target portion covering the target pixel unit group and coupled to the compensation electrode corresponding to the target pixel unit group via a first electrode layer of at least one auxiliary electrode.

11. The display substrate according to claim 10, wherein each pixel unit group comprises two pixel units arranged along a second direction crossing the first direction, an orthogonal projection of the compensation electrode onto the substrate is arranged between orthogonal projections of two pixel units in the corresponding pixel unit group onto the substrate.

12. The display substrate according to claim 11, further comprising a plurality of sensing line corresponding to the plurality of pixel unit groups respectively, wherein an orthogonal projection of each sensing line onto the substrate is arranged between the orthogonal projections of two pixel units in the corresponding pixel unit group onto the substrate, the compensation electrode and the sensing line corresponding to a same group of pixel unit group are arranged at intervals at a same layer, and the orthogonal projection of the second electrode layer of the auxiliary electrode onto the substrate overlaps the orthogonal projection of the compensation electrode onto the substrate and the orthogonal projection of the sensing line onto the substrate.

13. The display substrate according to claim 10, wherein the compensation electrodes corresponding to the pixel unit groups arranged in a same column along the first direction are coupled to each other successively.

14. The display substrate according to claim 10, wherein the pixel unit comprises at least two sub-pixels arranged along a second direction crossing the first direction, each sub-pixel comprises a sub-pixel driving circuitry and a light-emitting element, and the sub-pixel driving circuitry comprises a first transistor, a second transistor, a third transistor and a storage capacitor;
a gate electrode of the first transistor is coupled to a second electrode of the second transistor, a first electrode of the first transistor is coupled to a power supply line of the display substrate, and the second electrode of the first transistor is coupled to the light-emitting element;
a gate electrode of the second transistor is coupled to a corresponding scanning line of the display substrate, and a first electrode of the second transistor is coupled to a corresponding data line;
a gate electrode of the third transistor is coupled to a corresponding scanning line of the display substrate, a first electrode of the third transistor is coupled to the second electrode of the first transistor, and a second electrode of the third transistor is coupled to a corresponding sensing line; and
a first plate of the storage capacitor is coupled to the gate electrode of the first transistor, and a second plate of the storage capacitor is coupled to the second electrode of the first transistor.

15. A display device, comprising the display substrate according to claim 1.

16. A method for manufacturing a display substrate, comprising:
forming a compensation electrode on one side of a substrate;
forming an auxiliary electrode on one side of the compensation electrode from the substrate, the auxiliary electrode being coupled to the compensation electrode, a first notch being formed in a side surface of the auxiliary electrode, at least a part of the first notch extending in a direction parallel to the substrate;
forming a light-emitting functional layer on one side of the auxiliary electrode away from the substrate, the light-emitting functional layer being interrupted at the first notch; and
forming a cathode layer on one side of the light-emitting functional layer away from the substrate, the cathode layer being coupled to the auxiliary electrode at the first notch,
wherein the display substrate further comprises a data line, and the forming the compensation electrode on the substrate comprises forming the compensation electrode and the data line simultaneously through a single patterning process.

17. The display substrate manufacturing method according to claim 16, wherein the forming the auxiliary electrode on one side of the compensation electrode away from the substrate comprises:
forming a first electrode layer, the first electrode layer being coupled to the compensation electrode; and
forming a second electrode material layer and a third electrode material layer laminated one on another on one side of the first electrode layer away from the substrate, and patterning the second electrode material layer and the third electrode material layer simultaneously to form a second electrode layer and a third electrode layer, a first notch being formed between the first electrode layer and the third electrode layer.

18. The display substrate manufacturing method according to claim 17, wherein the display substrate further comprises an anode layer, the anode layer comprises a plurality of anode patterns, and each anode pattern comprises a first anode sub-pattern, a second anode sub-pattern, and a third anode sub-pattern laminated one on another in a direction away from the substrate;
the forming the first electrode layer comprises forming the first electrode layer and the first anode sub-pattern simultaneously through a single patterning process, and annealing the first electrode layer; and
the patterning the second electrode material layer and the third electrode material layer simultaneously to form the second electrode layer and the third electrode layer comprises patterning the second electrode material layer and the third electrode material layer simultaneously to form the second anode sub-pattern, the third anode sub-pattern, the second electrode layer and the third electrode layer simultaneously, and forming a second notch between the first anode sub-pattern and the third anode sub-pattern.

\* \* \* \* \*